(12) United States Patent
Theiss et al.

(10) Patent No.: US 8,826,528 B2
(45) Date of Patent: Sep. 9, 2014

(54) ELECTRICAL CONNECTIONS FOR ANODIZED THIN FILM STRUCTURES

(75) Inventors: Steven D. Theiss, Woodbury, MN (US); Michael A. Haase, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 286 days.

(21) Appl. No.: 13/131,740

(22) PCT Filed: Dec. 3, 2009

(86) PCT No.: PCT/US2009/066541
§ 371 (c)(1),
(2), (4) Date: May 27, 2011

(87) PCT Pub. No.: WO2010/074913
PCT Pub. Date: Jul. 1, 2010

(65) Prior Publication Data
US 2011/0242778 A1 Oct. 6, 2011

Related U.S. Application Data (60) Provisional application No. 61/140,134, filed on Dec. 23, 2008.

(51) Int. Cl.
*H05K 3/00* (2006.01)
*H01L 21/768* (2006.01)
*H05K 3/40* (2006.01)
*H01L 27/12* (2006.01)

(52) U.S. Cl.
CPC ........ *H01L 21/76802* (2013.01); *H05K 3/4092* (2013.01); *H01L 27/1214* (2013.01)
USPC .................. 29/842; 29/829; 29/85; 29/592.1; 361/774; 361/760; 361/748; 361/679.01; 361/600; 205/50; 205/124; 205/123; 205/122; 205/80

(58) Field of Classification Search
USPC ......... 29/842, 592.1, 825, 829; 361/774, 760, 361/748, 679.01, 600, 772; 205/50, 124, 205/123, 122, 125, 117, 80
See application file for complete search history.

(56) References Cited

U.S. PATENT DOCUMENTS 3,859,178 A * 1/1975 Logan et al. .................. 438/498
4,469,568 A 9/1984 Kato
(Continued)

FOREIGN PATENT DOCUMENTS

JP H09-297320 A 11/1997

OTHER PUBLICATIONS

Arai, "Aluminum-based gate structure for active-matrix liquid crystal displays", IBM J. Res. Develop., May/Jul. 1998, vol. 42, No. 3-4, pp. 491-499.
(Continued)

*Primary Examiner* — Peter DungBa Vo
*Assistant Examiner* — Azm Parvez
(74) *Attorney, Agent, or Firm* — Yufeng Dong; Jean A. Lown; Jay R. Pralle (57) ABSTRACT

Approaches for formation of a circuit via which electrically connects a first thin film metallization layer a second thin film metallization layer are described. Via formation involves the use of an anodization barrier and/or supplemental pad disposed in a via connection region prior to anodization of the first metallization layer. The material used to form the barrier is substantially impermeable to the anodization solution during anodization, and disrupts the formation of oxide between the electrically conducting layer and the barrier. The supplemental pad is non-anodizable, and is covered by the barrier to substantially prevent current flow through the pad during anodization. Following anodization, the barrier is removed. If the supplemental pad is sufficiently conductive, it can be left on the first metallization layer after removal of the barrier. The second metallization layer is disposed over the anodized layer, making electrical contact with the first electrically conductive layer in the via connection region.

12 Claims, 10 Drawing Sheets

(56) References Cited

U.S. PATENT DOCUMENTS

| | | | |
|---|---|---|---|
| 5,098,860 A * | 3/1992 | Chakravorty et al. | 438/628 |
| 5,240,868 A | 8/1993 | Bae | |
| 5,648,146 A | 7/1997 | Gotou et al. | |
| 5,849,604 A | 12/1998 | Sugawara | |
| 5,852,481 A * | 12/1998 | Hwang | 349/43 |
| 2005/0017302 A1 | 1/2005 | Hoffman | |
| 2005/0139823 A1 | 6/2005 | Hirakata | |
| 2008/0093744 A1 * | 4/2008 | Wang et al. | 257/758 |
| 2008/0157080 A1 * | 7/2008 | Gruner et al. | 257/59 |

OTHER PUBLICATIONS

International Search Report for PCT/US2009/066541, 3 pages.

* cited by examiner

ELECTRICAL CONNECTIONS FOR ANODIZED THIN FILM STRUCTURES

CROSS REFERENCE TO RELATED APPLICATIONS

This application is a national stage filing under 35 U.S.C. 371 of PCT/US2009/066541, filed Dec. 3, 2009, which claims priority to Provisional Application No. 61/140,134, filed Dec. 23, 2008, the disclosure of which is incorporated by reference in its/their entirety herein.

TECHNICAL FIELD

The present invention is related to systems and methods used in fabricating thin film structures.

BACKGROUND

Thin film circuits are widely used in the electronics industry and have become a predominant technology in flat panel display applications. Generally, thin film circuits are layered structures comprising regions of electrically conducting, semiconducting, and/or insulating layers deposited on a substrate. In a typical structure, two layers of conducting or semiconducting material are separated by a layer of an insulating dielectric. When a connection is desired between the separated layers, the insulator is removed in the connection region and a via is formed which electrically connects the two layers. The electrical and mechanical properties of the interconnecting via depend on the properties of the separated layers as well as the materials and processes used to form the via.

In some circumstances, it is advantageous to deposit a metallization layer so that the electrodes for various circuit components are initially electrically connected. Such a process serves to facilitate a subsequent fabrication step that involves all the interconnected components, such as anodization of the metallization layer. After anodization and/or other processing steps, the interconnected components may be electrically disconnected on the metallization layer.

It is desirable to improve processes for fabricating thin film circuits, including forming circuit connections and/or disconnections, to enhance circuit performance and to reduce the cost of fabrication. The present invention fulfils these and other needs, and offers other advantages over the prior art.

SUMMARY

Embodiments of the invention are directed to methods and systems involving via connections or disconnections for thin film circuits. One embodiment is directed to a method of forming an electrical connection between a first electrically conductive layer and a second electrically conductive layer on a substrate. A pad is formed in electrical contact with the first layer in a connection region. The pad comprises an electrically conductive material different from the material of the first layer. Regions of the first layer are anodized. After anodizing, the pad is exposed, such as through an etching process. A second layer is deposited, making electrical contact with the exposed pad.

Another embodiment of the invention involves a fabrication method for electrical circuitry. Photoresist is patterned on an electrically conductive layer in one or more disconnection/connection regions and is hardened. The electrically conductive layer is anodized in regions. The connection/disconnection regions remain substantially unanodized. After anodizing, the hardened photoresist is removed to expose the electrically conductive layer at the disconnection/connection regions. According to one implementation, the electrically conductive layer is connected to another electrically conductive layer at the disconnection/connection regions. According to another implementation, a first portion of the electrically conductive layer is disconnected from a second portion of the electrically conductive layer at the connection/disconnection regions.

Another embodiment is directed to a circuit subsystem. The circuit subsystem includes a first layer comprising a first electrically conductive material on a flexible substrate. Hardened photoresist is disposed on the first layer in one or more discrete disconnection/connection regions. The circuit subsystem also includes a layer comprising an anodized form of the first material. The anodized layer is formed on portions of the first layer other than the disconnection/connection regions.

Yet another embodiment is directed to a thin film electric circuit. A first circuit layer comprising an electrically conductive, anodizable material is configured to form an electrode of a first electronic device. An anodized layer comprising an anodized form of the material of the first circuit layer is disposed on the first circuit layer. A second circuit layer is disposed on the anodized layer and is configured to form an electrode of a second electronic device. A via electrically connects the electrode of the first electronic device to the electrode of the second electronic device. The via incorporates an electrically conductive, non-anodizable pad.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

In the following description of various exemplary embodiments, reference is made to the accompanying drawings which form a part hereof, and in which is shown by way of illustration various embodiments in which the invention may be practiced. It is to be understood that other embodiments may be utilized, as structural and operational changes may be made without departing from the scope of the present invention.

Thin film circuits are typically layered structures comprising regions of conducting, semiconducting and/or insulating materials. Many useful circuits involve multiple layers of metallization separated by a separating layer, which may be a semiconductor or insulator layer. When an electrical connection between two or more metallization layers is desired, an interconnection structure, referred to as a "via," is formed between the two metallization layers through the separating layer to electrically connect the metallization layers. In preparation for via formation, after formation of the separating layer on one of the metallization levels, the separating layer may be etched in the interconnection region to expose the buried metallization layer. Alternatively, during fabrication of the separating layer, gaps in the separating layer can be made in preparation for via formation by masking or otherwise preventing the formation of the separating layer on the first metallization layer in the via connection region prior to deposition of the second metallization layer.

Figure 1A:
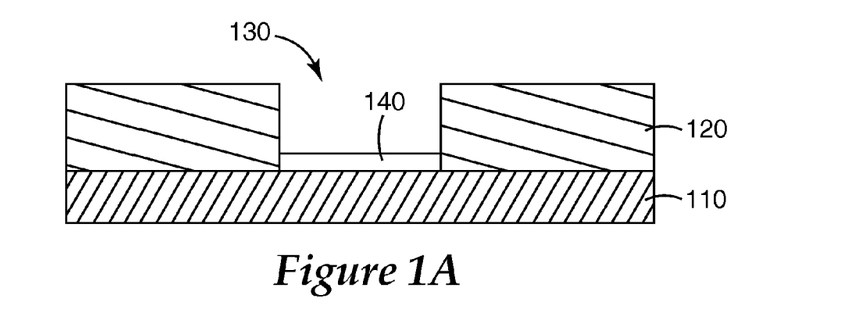
FIG. 1A is a cross sectional diagram of a thin film structure illustrating the problem of under-etching.

Aluminum (Al) and aluminum-based alloys are frequently used for circuit metallization because these materials are relatively inexpensive, form stable oxides, can be deposited by a number well known deposition processes, such as sputtering or vacuum evaporation, and are well suited to thin film applications. Aluminum anodizes to form $Al_2O_3$, a stable oxide that can be used to provide an anodized layer between circuit metallization levels and/or can serve as a dielectric layer for field effect transistors, for example. However, etching multilayer films comprising Al and $Al_2O_3$ layers can be problematic because the chemicals used for etching are not selective in etching $Al_2O_3$ vs. Al. The etching process for the $Al_2O_3$—Al layers is difficult to control, which may result in under-etching or over-etching the layers. FIG. 1A is a cross section of a thin film structure illustrating the problem of under-etching after anodization. In this scenario, the metal of the first level metallization layer 110 is anodized forming an anodized layer 120. Via formation by etching requires etching through the anodized layer 120 in a via connection region 130 to access the buried metallization layer 110. However, anodized material 140 can remain in the via connection region 130 after etching. Although the remaining anodized material may be thin or may be present only in discrete islands within the via connection region, the presence of the anodized material increases the resistance of the via contact between the metallization layers and can degrade the performance of the thin film circuit.

Figure 1B:
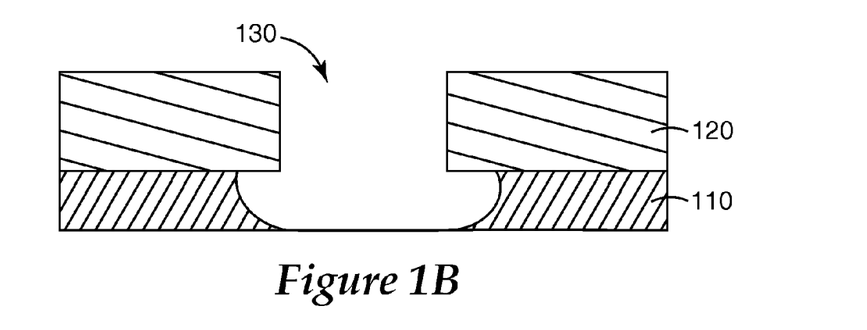
FIG. 1B is a cross sectional diagram of a thin film structure illustrating the problem of over-etching.

FIG. 1B illustrates the problem of over-etching wherein the etching process not only removes the anodized layer 120 in the via connection region 130, but also etches partially or completely through the metallization layer 110 as well. Overetching is difficult to control particularly if the etch process is not selective.

Figure 2:
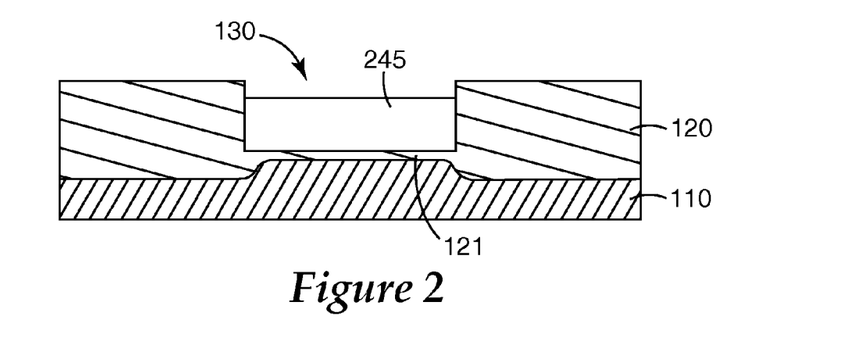
FIG. 2 illustrates a situation which arises when a non-hardened photoresist mask fails to inhibit anodization in a disconnection/connection region.

An alternate approach to via formation involves masking the via connection regions with photoresist to prevent formation of anodized material in the masked regions during the anodization step. However, this approach is also associated with problems that impede the formation of low resistance electrical connection. FIG. 2 illustrates a situation which arises when a non-hardened photoresist mask 245 is used to inhibit anodization in the via connection region 130. The anodization solution may permeate the photoresist mask 245, leading to a layer 121 of anodized material formed under the photoresist mask 245 in the via connection region 130. As with the under-etching scenario described above, the presence of anodized material in the via connection region 130 degrades the electrical contact between metallization levels. The situations illustrated in FIG. 1A, FIG. 1B, and FIG. 2 can result in poor contact between metallization layers which is undesirable.

Embodiments of the invention are directed to the use of a barrier and/or an electrically conductive pad disposed in a via connection region which facilitate via formation. The barrier and/or pad are disposed proximate to an electrically conducting layer of a thin film structure. In some embodiments, a barrier is used to protect the electrically conductive layer and is subsequently removed during via formation. In some embodiments, an electrically conductive pad is formed in the via connection regions with or without a barrier. All or portions of the conductive pad remain to form an integral part of the via.

In some configurations, the barrier is disposed on the electrically conductive layer prior to anodization and forms a barrier to the anodization process. The barrier, which may be patterned on the electrically conductive layer using standard photolithographic techniques, reduces or prevents the anodization of the underlying portion of the electrically conducting layer. The material used to form the barrier may be substantially impermeable to the anodization solution during anodization, and thus disrupts the formation of oxide between the electrically conducting layer and the barrier. The barrier may be used with or without a supplemental pad formed on the conducting layer in the via connection region prior to anodization. The supplemental pad may be an electrically conductive, non-anodizable pad, in which case it is covered by a barrier of photoresist or other removable insulating layer to substantially prevent current flow through the non-anodizable pad during anodization. If the supplemental pad is sufficiently conductive, it can be left on the conducting layer after removal of the barrier. The material used to form the pad may be a conductive material that does not form an insulating oxide by anodization. After removal of the barrier from the via connection region, a second electrically conductive layer is disposed over the anodized layer, making electrical contact with the first electrically conductive layer in the via connection region.

In some configurations, an electrically conductive pad is disposed between the substrate and the first conducting layer, making electrical contact with the first conducting layer in the via connection region. In these configurations, via formation involves etching or otherwise forming a via through any layer disposed on the first conducting layer, such as the anodized layer, and also through the first conducting layer to expose the pad in the via connection region. This may be accomplished with an etchant that etches the first conducting layer selectively with respect to the pad. A second metallization layer is formed over the anodized layer and electrically connects to the exposed pad, thereby forming an electrical via between the first and second conducting layers. Electrical contact may also be made between the first and second electrically conductive layers through the sides of the etched region of the first conductive layer.

Figure 3A:
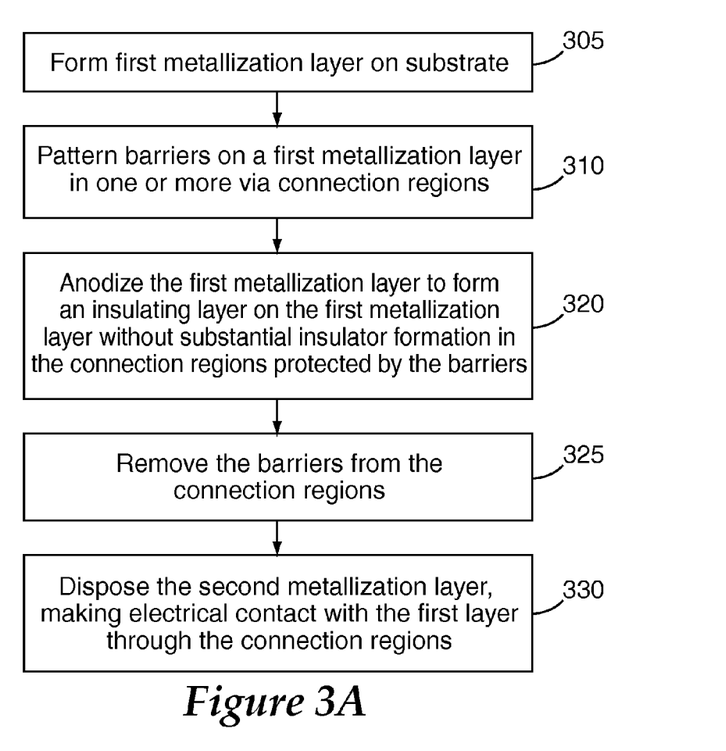
FIG. 3A is a flow diagram illustrating the use of anodization barriers in the formation of vias to electrically connect first and second electrically conducting layers of a thin film structure in accordance with embodiments of the invention.

The flow diagram of FIG. 3A illustrates formation of vias to electrically connect first and second electrically conducting layers of a thin film structure in accordance with embodiments of the invention. The electrically conducting layers are referred to herein as "metallization layers," although the material used to form the electrically conducting layers need not be strictly metallic, but may comprise metals, metal alloys, metal oxides, doped semiconductors, and/or any other material having an electrical conductivity sufficient to provide electrical connections between circuit elements. Furthermore, an electrically conducting layer may comprise a plurality of sub-layers, where one sub-layer may include materials distinct from another sub-layer.

The first metallization layer is formed 305 on a substrate, the substrate optionally being a flexible material, such as a polymer or a foil. Alternatively, the substrate may be made of a rigid material, such as glass. A flexible substrate may be implemented as an elongated layer or web, which advantageously allows formation of the thin film structures described herein using a roll-to-roll manufacturing process. As previously discussed, the first metallization layer may comprise one or more metals, including aluminum (Al), magnesium (Mg), tantalum (Ta), titanium (Ti), molybdenum (Mo), tungsten (W). The material used for the first metallization layer is anodizable, although non-anodizable materials may additionally be used for unexposed sub-layers of the first metallization layer.

One or more barriers are patterned 310 on the first metallization layer in one or more via connection regions. The barriers formed on the first metallization layer comprise one or more materials that protect the underlying first metallization layer from anodization, by serving as a barrier to the diffusion of anodization solution through the barriers.

Following the formation of the barriers, the first metallization layer is anodized 320 to form an anodized layer on the metallization layer. The barriers protect the first metallization layer from anodization in the connection regions where vias are to be formed. After anodization, the barrier is removed 325. After removal of the barrier, a cleaning step, e.g., plasma cleaning, may be implemented to remove any residual oxidation from the metallization in the via region. The second metallization layer is deposited 330 over the anodized layer and into the via connection regions, making electrical contact with the first metallization layer through the via connection regions.

Figure 3B:
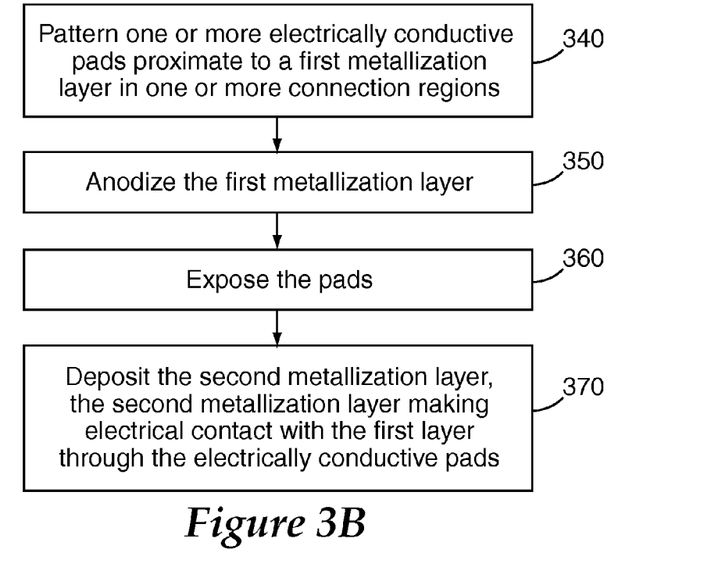
FIG. 3B is a flow diagram illustrating a method involving the use of electrically conductive pads in via connection regions of a thin film structure in accordance to embodiments of the invention.

FIG. 3B illustrates a method according to embodiments of the invention which involves the use of electrically conductive pads in the via connection regions. The electrically conductive pads may be used with or without the anodization barriers described herein.

One or more electrically conductive pads are patterned 340 to make electrical contact with a first metallization layer. In some implementations, the electrically conductive pads are patterned on the substrate in the via connection regions and the first metallization layer is patterned over the pads so that the pads are arranged between the substrate and the first metallization layer. In some implementations it may be advantageous to form the pads and the electrodes of other electronic circuit elements, such as transistors, diodes, capacitors and/or resistors, in the same processing step. One particularly useful implementation is a display backplane, wherein the pixel electrodes and electrically conductive pads are formed of a transparent conductor and are patterned together on the substrate in one processing step. For example, the electrodes of organic light emitting diode (OLED) pixel elements or liquid crystal pixel elements may be patterned in the same processing step as the pads. In implementations requiring transparency, a transparent conductive oxide, such as indium tin oxide, is a useful material for pad formation, although in other configurations metals, metal alloys, doped semiconductors and/or other electrically conductive materials may be used for the pad. If a metal is used for the pad, the metal may include gold (Au), silver (Ag), platinum (Pt), palladium (Pd), or other similar metals. In general, any conductive material may be useful to form the pads. In some implementations, the first metallization layer is deposited on the substrate and the electrically conductive pads are disposed on the first metallization layer in the via connection regions.

Following formation of the electrically conductive pads and the first metallization layer, the first metallization layer is anodized 350 to form an anodized layer. If electrically conductive pads are formed on the first metallization layer, anodization barriers of photoresist or another insulating material may be formed over the pads prior to anodization. The anodization barriers may be formed of any material that sufficiently insulates the conductive pads and/or prevents anodization of the first metallization layer in the via connection region. Either individually or in combination, a barrier and an associated electrically conductive pad prevents or reduces anodization of the first metallization layer in the via connection region. In some implementations, the pad may only include one layer, but in other implementations the pad includes a plurality of sub-layers. The sub-layers may be selected to impart desirable properties to the barrier or pad that facilitate processing or enhance the electrical and/or mechanical properties. For example, the material selected for one or more sub-layers of the pad may be selected to reduce alloying between the material of the pad and the material of the first and/or second layers. Alternatively or additionally, the material of one or more sub-layers of the barrier and/or pad may be selected to promote adhesion between the barrier and/or pad and adjacent layers.

Photoresist is one type of material that is useful to form the barriers. The photoresist may be patterned on the first metallization layer using photolithography, for example. In some implementations, the photoresist is hardened by heating to enhance impermeability to the anodization solution.

After anodization, the electrically conductive pads are exposed 360. For example, in some embodiments, the pads are exposed by etching or otherwise removing the anodization layer and the first metallization layer in the via connection regions. In embodiments which use pads and anodization barriers on the first metallization layer, the pads may be exposed by removing the anodization barriers. A second metallization layer is deposited 370 over the anodized layer and makes electrical contact with the first metallization layer through the exposed pads.

Figure 4:
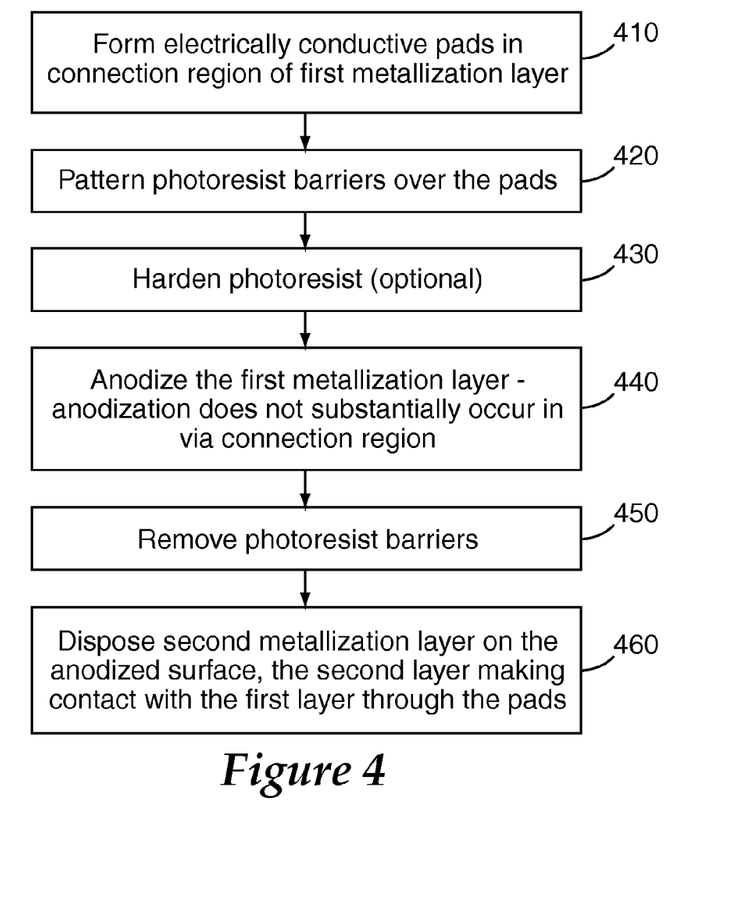
FIG. 4 is a flow diagram that illustrates formation of vias using barriers in conjunction with electrically conductive pads in accordance with embodiments of the invention.

The flow diagram of FIG. 4 further illustrates a method for via formation in accordance with embodiments of the invention. The method of FIG. 4 involves the use of anodization barriers in conjunction with electrically conductive pads that remain on the first metallization layer and become components of the via connections between circuit layers. In this embodiment, the one or more electrically conductive pads are formed 410 on the first metallization layer and may form a supplemental anodization barrier. The electrically conductive pads may comprise gold (Au) or other metals, alloys, conductive oxides, and/or other conductive materials deposited on the first metallization layer in the via connection regions. The pads may be patterned on the first metallization layer using a lift off process, for example.

In preparation for anodization, the metal pads are covered 420 by a photoresist barrier. The photoresist may optionally be hardened 430 by baking at a temperature sufficient to soften or melt the photoresist, typically over about 115 C. The first metallization layer is anodized 440 and the photoresist is removed 450, exposing the electrically conductive pads. When the second metallization layer is deposited 460, electrical contact is made between first and second metallization layers through the electrically conductive pads in the via connection regions.

Figure 5A:
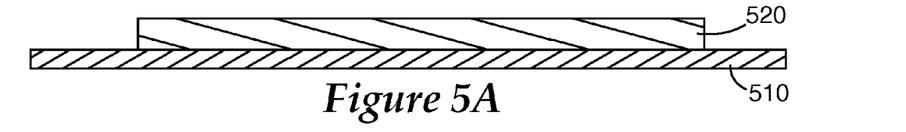
FIGS. 5A-5F are cross-sectional diagrams depicting various thin film subsystems that are formed during the via formation process depicted in FIG. 4.
Figure 5B:
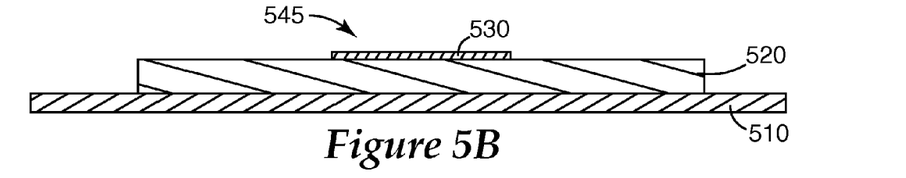
Figure 5C:
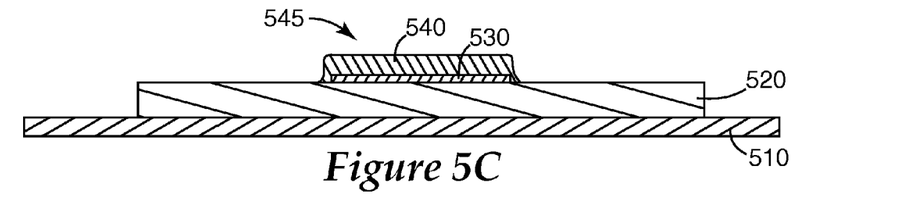
Figure 5D:
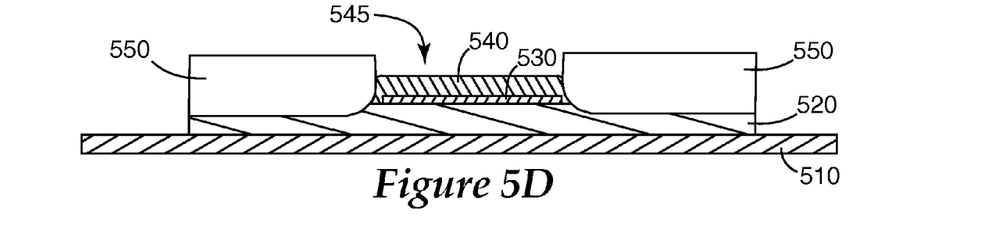
Figure 5E:
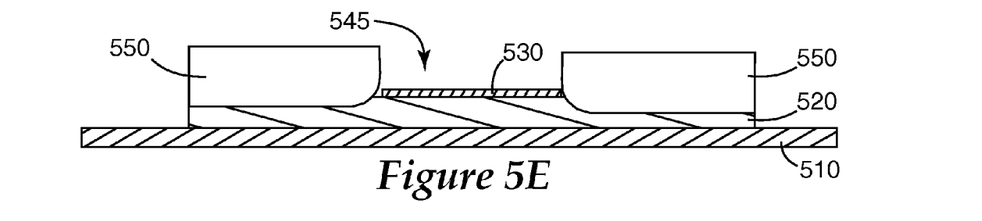
Figure 5F:
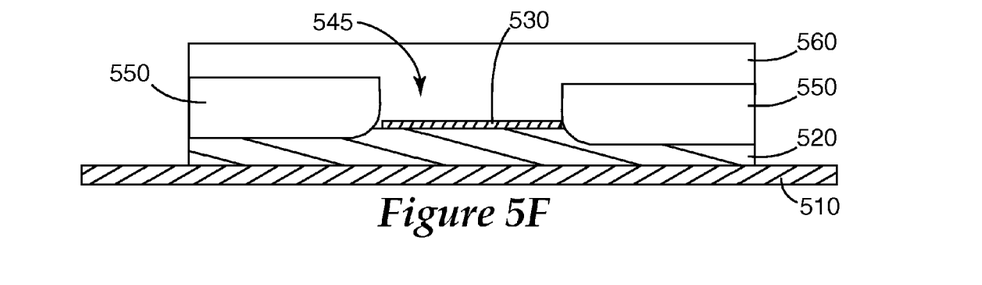

The cross sectional diagrams of FIGS. 5A-5F illustrate various thin film subsystems that are formed during the process described by FIG. 4. The cross-sectional diagram of FIG. 5A shows the first metallization layer 520 deposited on a substrate 510. A metal pad 530 is formed on the first metallization layer in the connection region 545 (FIG. 5B). Photoresist 540 is patterned on the metal pad 530 (FIG. 5C). The photoresist 540 covers the exposed surfaces of the metal pad 530 during anodization to prevent current flow through the non-anodizable metal pad which could inhibit the voltage required to form a high quality anodized layer. The subsystem following the anodization process is illustrated in FIG. 5D. After anodization, the first metallization layer 520 is substantially covered with an anodized layer 550. Anodization does not occur in the via connection region 545 where the first metallization layer 520 is covered by the metal pad 530 and the photoresist 540. Removal of the photoresist 540 after anodization exposes the metal pad 530 (FIG. 5E). When the second metallization layer 560 is deposited, electrical contact is made between the first and second metallization layers 520, 560 in the via connection region 545 through the metal pad 530 (FIG. 5F).

Figure 6:
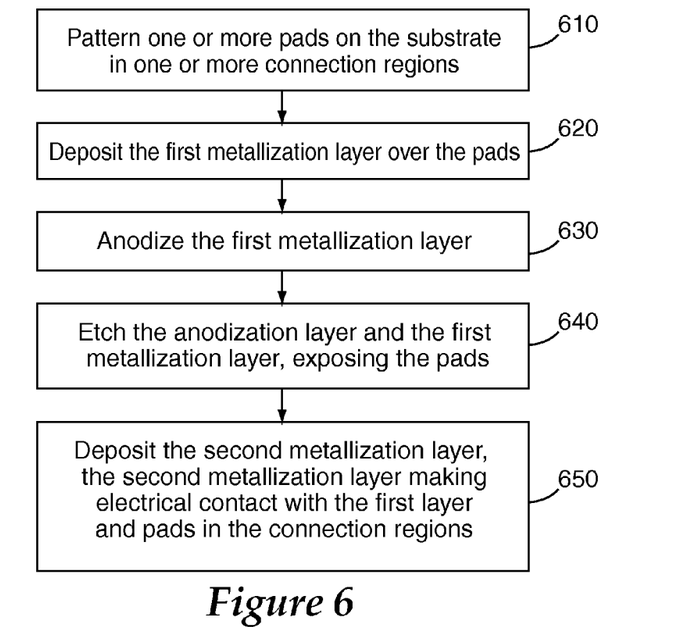
FIG. 6 is a flow diagram illustrating a via formation process in accordance with embodiments of the invention.

The via formation process illustrated by the flow diagram of FIG. 6 is particularly useful in the formation of display backplanes. In this process, electrically conductive pads used for via formation are formed 610 in one processing step. It may be convenient to form the pixel electrodes for the display backplane during the same fabrication step as the electrically conductive via pads. The first metallization layer is deposited 620 over the electrically conductive pads. The first metallization layer is anodized 630. Following anodization, the pads are exposed by etching 640 the anodization layer in the via connection regions. The second metallization layer is deposited 650 over the anodization layer, the second metallization layer making electrical contact with the first layer and the pads in the connection regions.

Figure 7A:
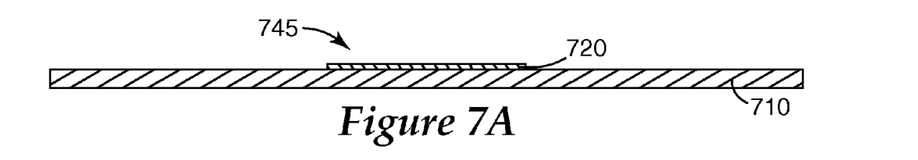
FIGS. 7A-7E are cross-sectional diagrams depicting thin film subsystems that are formed during the via formation process depicted in FIG. 6.
Figure 7B:
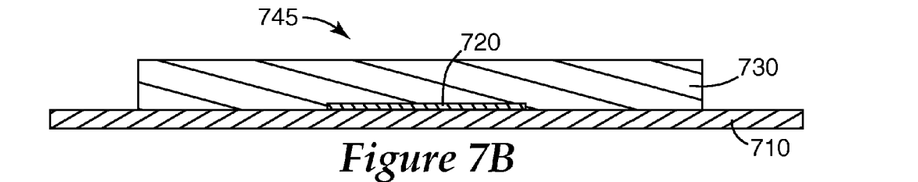
Figure 7C:
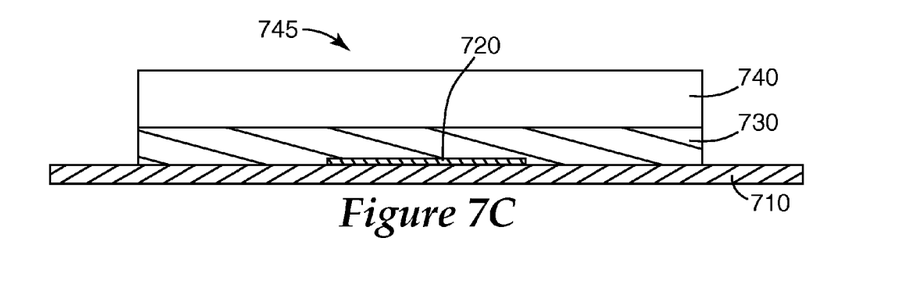
Figure 7D:
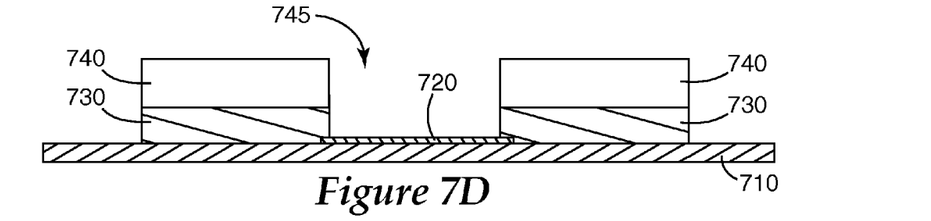
Figure 7E:
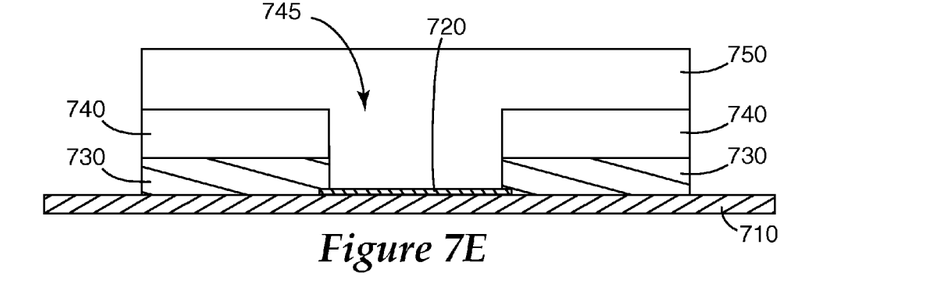

The cross sectional diagrams of FIGS. 7A-7E depict various thin film subsystems that are formed during the process described by FIG. 6. As illustrated in FIG. 7A, an electrically conductive pad 720 is formed on a substrate 710 in a via connection region 745. After formation of the first metallization layer 730 over the pad 720 (FIG. 7B), the first metallization layer 730 is anodized to form an anodized layer 740 (FIG. 7C). The anodized layer 740 and the first metallization layer 730 are etched in the via connection regions 745 to expose the pad 720 (FIG. 7D). The second metallization layer 750 is formed over the anodized layer 740, making electrical contact to the pad 720 to the first metallization layer 730 (FIG. 7E).

Figure 8A:
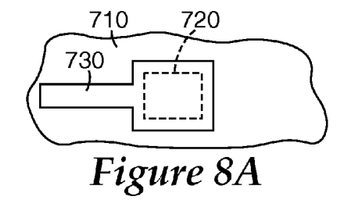
FIGS. 8A-8F are top views of thin film subsystems that are formed during the via formation process depicted in FIG. 6.
Figure 8B:
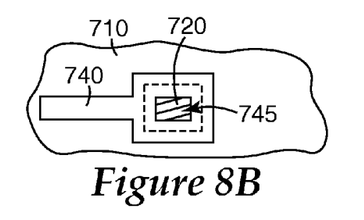
Figure 8C:
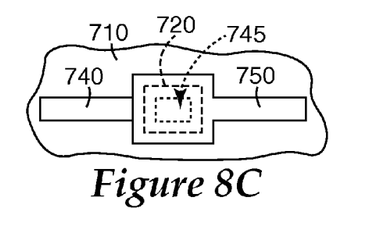

FIGS. 8A-8C illustrate the process described in FIG. 6 by a series of top views of various thin film subsystems formed during the process. FIG. 8A is a top view of the electrically conductive pad 720 formed on the substrate 710. As illustrated in FIG. 8A, in some embodiments, the metallization layer may initially cover the pad completely. FIG. 8B illustrates the subsystem of FIG. 8A after anodization and etching the anodization layer 740 and the first metallization layer 730 in the via connection region 745. FIG. 8C illustrates a top view of the subsystem after the second metallization layer 750 is formed.

Figure 8D:
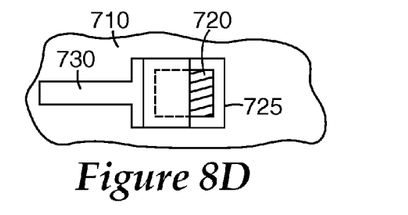
Figure 8E:
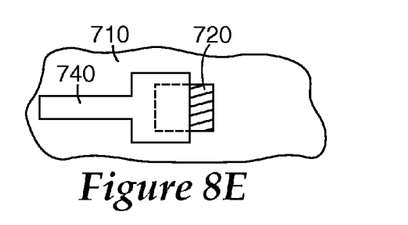
Figure 8F:
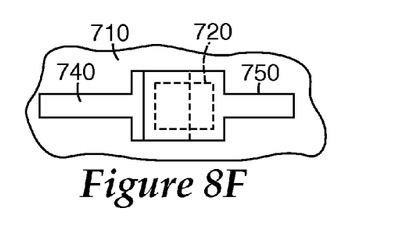

In some other embodiments, the metallization layer may cover only a portion of the pad, as shown in FIG. 8D. During anodization, a barrier 725 such as photoresist may be used to cover portions of the pad not covered by the metallization layer. FIG. 8E illustrates the subsystem of FIG. 8D after anodization and removal of the barrier. FIG. 8F illustrates a top view of the subsystem after the second metallization layer 750 is formed.

According to one aspect of the invention, the barrier may comprise a region of hardened photoresist with or without an electrically conductive pad in the via connection region. Hardened photoresist may be used to prevent oxide formation in a region where a via is desired or where a disconnection or cut in the metallization is required to electrically disconnect a first portion of a metallization layer from another portion of the metallization layer. Prevention of oxide formation in the region where a cut is desired facilitates processing of the thin film structure when the oxide is more difficult to remove than the exposed metallization layer without the oxide layer. The flow diagram of FIG. 6 illustrates formation of an electrical connection and/or formation of an electrical disconnection in processes that use hardened photoresist to prevent the oxide formation in a region of a metallization layer.

Figure 9:
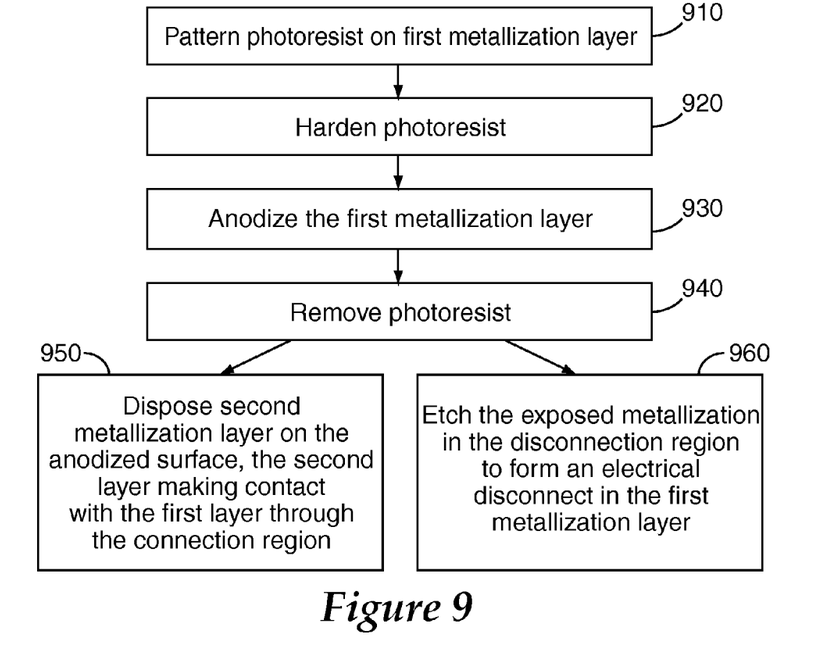
FIG. 9 is a flow diagram illustrating methods for formation of an electrical connection and formation of an electrical disconnection in accordance with embodiments of the invention.

FIG. 9 is a flow diagram of processes that may be used to form a via connection between two metallization layers or to electrically disconnect a metallization layer into separate regions. According to this process, a first metallization layer is deposited on a substrate. A photoresist barrier is patterned 910 in a disconnection/connection region on the first metallization layer and is hardened 920 by processing at a temperature sufficient to soften or melt the photoresist, typically over about 115 C. The first metallization layer is anodized 930. The hardened photoresist prevents oxide formation between the hardened photoresist and the first metallization layer. The photoresist is removed 940 from the first metallization layer leaving a pattern of unanodized disconnection/connection regions. For the via formation process, the second metallization layer is deposited 950, making electrical connection to the first metallization layer through the via connection region. Alternatively, if electrical disconnection is desired, the first metallization layer is etched 960 in the disconnection region, electrically separating a first portion of the first metallization layer from a second portion of the metallization layer.

As previously described, the substrate on which the first metallization is deposited may be an elongated, flexible film to facilitate roll to roll processing of one or more of the processing steps described herein. For example, one or more of patterning the photoresist barrier on the first metallization layer, hardening the photoresist, anodizing the first metallization layer in regions not covered by the photoresist barrier, removing the hardened photoresist, and connecting the first electrically conductive layer to a second electrically conductive layer or disconnecting the portions of the first electrically conductive layer may be performed as part of a roll-to-roll process.

Figure 10A:
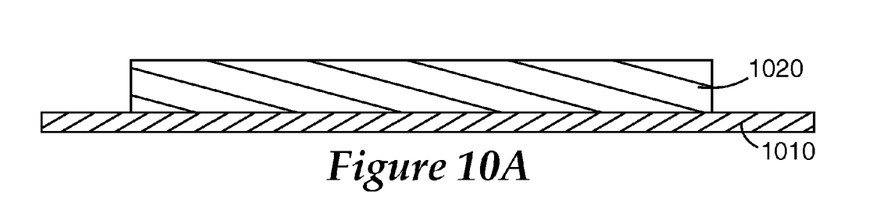
FIGS. 10A-10D illustrate various thin film subsystems that are formed during a process using hardened photoresist to prevent anodization in a disconnection/connection region in accordance with embodiments of the invention.
Figure 10B:
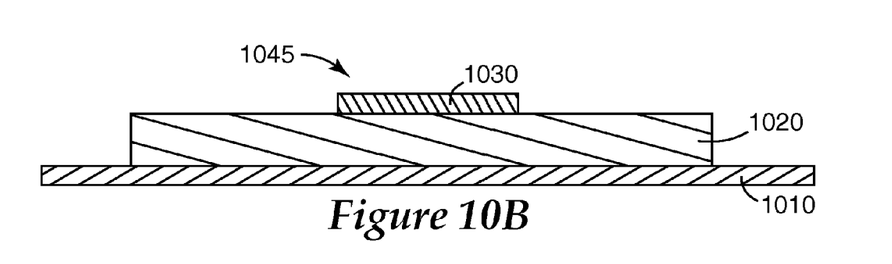
Figure 10C:
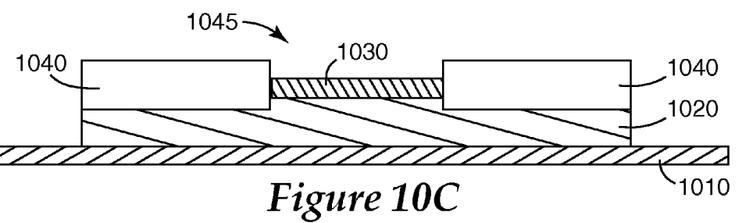
Figure 10D:
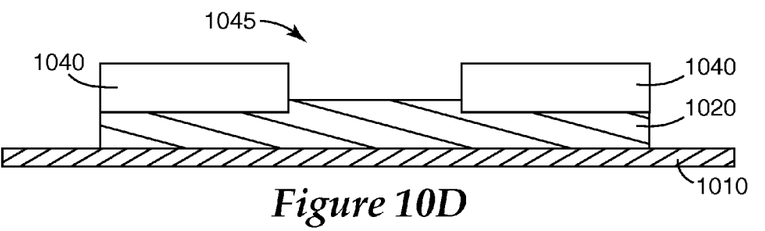

The cross sectional diagrams of FIGS. 10A-10F illustrate various thin film subsystems that are formed during the processes described by FIG. 9. The cross sectional diagram of FIG. 10A shows the first electrically conductive layer 1020 after deposition on a substrate 1010. Photoresist 1030 is patterned on the first conductive layer 1020 in disconnection/connection regions 1045 (FIG. 10B). The photoresist 1030 is then hardened by baking at a temperature sufficient to soften or melt the photoresist, typically over about 115 C. The first conductive layer 1020 is then anodized, forming an oxide, e.g., aluminum oxide, as an anodized layer 1040 on the first conductive layer 1020 (FIG. 10C). The presence of the hardened photoresist 1030 in the disconnection/connection regions 1045 prevents anodization in these regions 1045. Hardening the photoresist barrier pad 1030 decreases its permeability to the anodization solution and significantly reduces the anodization of the first conductive layer 1020 under the barrier 1030 in the disconnection/connection region 1045 when compared to a non-hardened photoresist barrier. Removal of the photoresist 1030 after anodization exposes the first conductive layer 1020 in the disconnection/connection region 1045 (FIG. 10D).

Figure 10E:
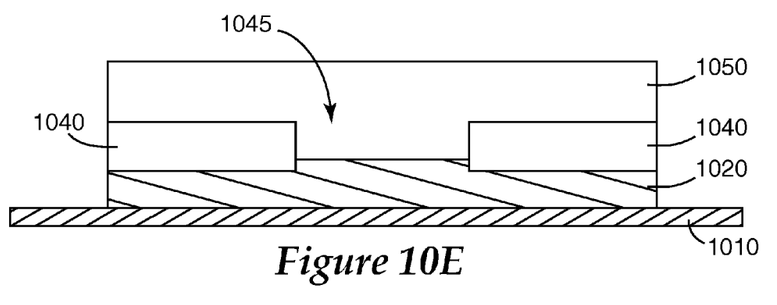
FIG. 10E depicts a cross-sectional diagram of a via formed in the disconnection/connection region of FIG. 10D in accordance with embodiments of the invention.
Figure 10F:
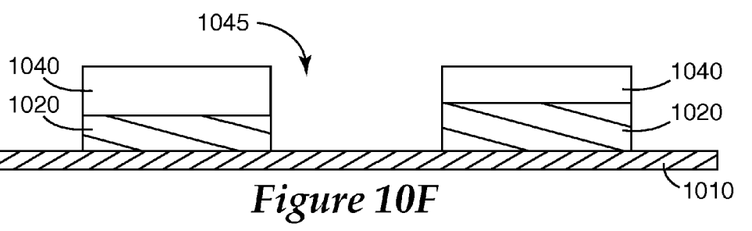
FIG. 10F depicts a cross sectional diagram of a disconnection made by removing the first metallization layer in the disconnection/connection region of FIG. 10D in accordance with embodiments of the invention.

For via formation, a second electrically conductive layer 1050 is deposited over the anodized layer 1040. Electrical contact is made between the first and second conductive layers 1020, 1050 in the connection region 1045 (FIG. 10E). Alternatively a disconnection may be made in the first conductive layer 1020 by etching the first conductive layer 1020 in the disconnection region 1045 after removal of the hardened photoresist (FIG. 10F).

Figure 11:
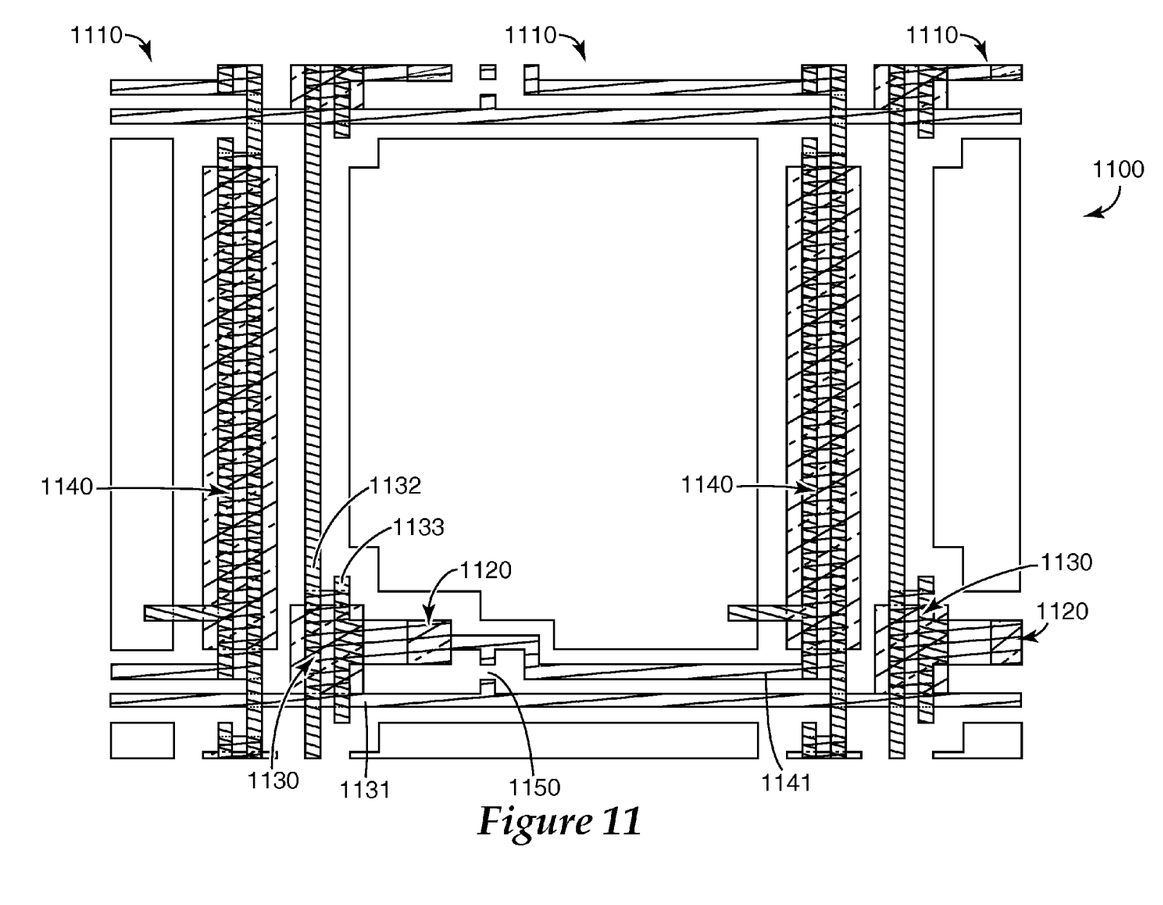
FIG. 11 is a top view of a display backplane that illustrates a via connection and a disconnection formed according to embodiments of the invention.

Embodiments of the invention are directed to processes and subsystems involved in the formation of electrical disconnections or connections of the metallization of thin film structures. The techniques described herein are particularly useful for low cost electronics such as digital circuits and display backplanes. Serial-in-parallel-out shift registers, inverters, memory circuits, and ring oscillators are examples of digital circuits that may use a first metallization layer to second metallization layer via connection. Display backplanes also represent a type of thin film circuit that may use via connections between metallization layers or disconnections of previously connected metallization layer portions. FIG. 11 illustrates a top view of a subsystem 1100 for an organic light emitting diode (OLED) display. The subsystem 1100 includes a number of OLED pixels 1110 arranged in an array. Vias 1120 are used to electrically connect a first metallization layer to a second metallization layer. The first metallization layer includes metallization for the gate electrodes 1131 of the OLED display switch transistors 1130, and the gate electrodes 1141 of the drive transistors 1140. The second metallization layer includes the source/drain electrodes 1132, 1133 of the OLED display switch transistors 1130. As illustrated in FIG. 11, the via 1120 connects the drive transistor gate electrode 1141 on the first metallization layer to the switch transistor drain electrode 1133 on the second metallization level.

FIG. 11 also illustrates a disconnection region 1150 which electrically separates the first metallization layer into first portions that includes the switch transistor gate electrodes 1131 and second portions that includes the drive transistor gate electrodes 1141. Initially, upon formation of the first metallization layer, the drive transistor gate electrodes 1141 are electrically connected to the switch transistor gate electrodes 1131 to facilitate anodization. Following the anodization, the switch transistor gate electrodes 1131 and drive transistor gate electrodes 1141 are electrically disconnected by removing the metal of the first metallization layer in the disconnect region 1150.

Figure 12:
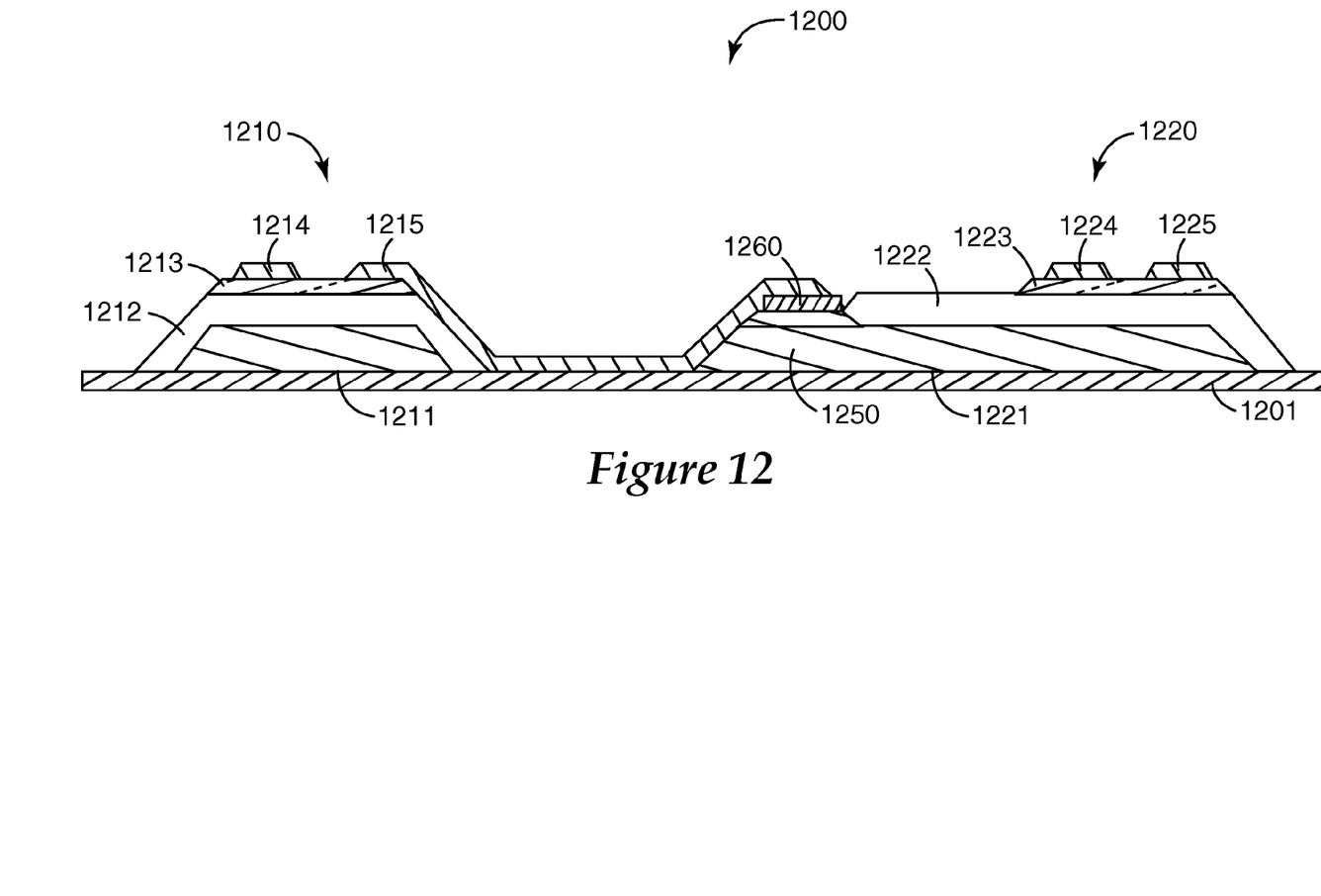
FIG. 12 is a cross sectional diagram of a thin film electrical circuit incorporating a via in accordance with embodiments of the invention.

FIG. 12 is a cross sectional diagram illustrating a thin film electric circuit 1200 formed on a substrate 1201 in accordance with embodiments of the invention. The electric circuit 1200 includes first and second TFTs 1210, 1220. The first metallization layer of the electric circuit 1200 includes the gate electrodes 1211, 1221 for the first and second TFTs 1210, 1220. Each of the TFTs 1210, 1220 includes a gate dielectric 1212, 1222 which is formed by anodizing the first metallization layer, and a semiconductor layer 1213, 1223. The second metallization layer includes source 1214, 1224 and drain 1215, 1225 electrodes, for each transistor 1210, 1220. The drain electrode 1215 of the first TFT 1210 is coupled to the gate electrode 1221 of the second TFT 1220 through via 1250. Via 1250 includes a pad 1260 formed of a conductive, non-anodizable material. The pad 1260 is deposited during the via formation process and is incorporated as an integral component of the via 1250. FIG. 12 shows the pad 1260 formed on the first metallization layer. Alternatively, the pad may be formed under the first metallization layer as illustrated in FIG. 7E.

The electrodes of other types of electronic devices may be connected using vias similar to the via illustrated in FIG. 12. For example, the electrodes of capacitors, resistors, diodes, etc., may be connected by a via incorporating a non-anodizable, conductive pad as illustrated herein. The example below describes a process of forming vias connecting metallization layers of thin film circuits, such as the those illustrated in FIGS. 11 and 12.

EXAMPLE

A. Gate (G) Level Metallization Formation
1. 15 minute 130 C oven pre-bake/pre-shrink for clean polyethylene napthalate (PEN) substrates
2. Deposit 7.5 nm SiO2 and 150 nm Al gate-level metal by sputtering.
3. Apply, expose and develop Futurrex PR1-1000A photoresist
4. Post-bake the sample at 115 C for 2 min.
5. Etch in the TRANSENE Aluminum Etchant Type A to pattern gate level.
6. Strip photoresist B. VIA Au Lift-Off (Formation of Au Barrier Pad)
1. Apply, expose and develop, FUTURREX NR9-3000PY photoresist for via pads
2. Deposit 5 nm Ti and 20 nm Au by sputtering
3. Lift-off photoresist with acetone and ultrasound to form via pads C. Anodization
1. Apply, expose and develop FUTURREX PR1-4000A photoresist (nominal thickness=4 μm)
2. Harden the photoresist by heating to 115 C for 15 min.

3. Anodize to 75 V (~975 Å of Al$_2$O$_3$) for 8 min.
4. Strip photoresist

D. Gate Disconnect Etch
1. Apply, expose and develop Futurrex PR1-1000A photoresist
2. Post-bake the sample at 115 C for 2 min.
3. Etch in the TRANSENE Aluminum Etchant Type A to disconnect gates
4. Strip photoresist E. Semiconductor (S) level
1. Deposit 55 nm ZnO by sputtering in Ar/O$_2$
2. Apply, expose and develop FUTURREX PR1-1000A photoresist
3. Etch ZnO in 0.1% aqueous HCll
4. Strip photoresist F. Source/Drain (S/D) Level Metallization
1. Apply, expose and develop Futurrex NR9-3000PY photoresist
2. Deposit 50 nm Ti and 200 nm Au by sputtering Lift-off photoresist with acetone and ultrasound to form source-drain level FUTURREX photoresists and ancillary chemicals are available from FUTURREX, INC., Franklin, N.J. TRANSENE etchant is available from TRANSENE COMPANY, INC., Danvers, Mass.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What claimed is:

1. A method of forming an electrical connection between a first electrically conductive layer and a second electrically conductive layer on a substrate, the method comprising:
    forming a non-anodizable pad in electrical contact with the first electrically conductive layer in a connection region, the non-anodizable pad comprising an electrically conductive material different from a material of the first electrically conductive layer, wherein forming the non-anodizable pad comprises:
        forming the first electrically conductive layer on the substrate; and
        forming at least a portion of the non-anodizable pad on the first electrically conductive layer;
    anodizing regions of the first electrically conductive layer;
    following the anodizing, exposing the non-anodizable pad; and
    disposing the second electrically conductive layer in electrical contact with the exposed non-anodizable pad.

2. The method of claim 1, further comprising coating at least a portion of the non-anodizable pad with photoresist prior to anodizing.

3. The method of claim 2, further comprising hardening the photoresist prior to anodizing.

4. The method of claim 1, wherein forming the non-anodizable pad comprises forming one or more sub-layers, at least one of the sub-layers configured to promote adhesion.

5. The method of claim 1, wherein the non-anodizable pad comprises one or more of gold, palladium, and a doped semiconductor.

6. The method of claim 1, wherein forming the non-anodizable pad comprises forming the non-anodizable pad and an electrode of an electronic device in the same deposition step.

7. A method of forming an electrical connection between a first electrically conductive layer and a second electrically conductive layer on a substrate, the method comprising:
    forming a pad in electrical contact with the first electrically conductive layer in a connection region, the pad comprising an electrically conductive material different from a material of the first electrically conductive layer, wherein forming the pad comprises:
        forming the first electrically conductive layer on the substrate; and
        forming at least a portion of the pad on the first electrically conductive layer;
    coating at least a portion of the pad with photoresist;
    anodizing regions of the first electrically conductive layer;
    following the anodizing, exposing the pad; and
    disposing the second electrically conductive layer in electrical contact with the exposed pad.

8. The method of claim 7, further comprising hardening the photoresist prior to anodizing.

9. The method of claim 7, wherein forming the pad comprises forming one or more sub-layers, at least one of the sub-layers configured to promote adhesion.

10. The method of claim 7, wherein the pad comprises one or more of gold, palladium, and a doped semiconductor.

11. The method of claim 7, wherein forming the pad comprises forming the pad and an electrode of an electronic device in the same deposition step.

12. A method of forming an electrical connection between a first electrically conductive layer and a second electrically conductive layer on a substrate, the method comprising:
    forming a pad in electrical contact with the first electrically conductive layer in a connection region, the pad comprising an electrically conductive material different from a material of the first electrically conductive layer, wherein forming the pad comprises forming one or more sub-layers, at least one of the sub-layers configured to promote adhesion, and wherein forming the pad further comprises:
        forming the first electrically conductive layer on the substrate; and
        forming at least a portion of the pad on the first electrically conductive layer;
    anodizing regions of the first electrically conductive layer;
    following the anodizing, exposing the pad; and
    disposing the second electrically conductive layer in electrical contact with the exposed pad.

* * * * *